United States Patent
Tsunoda et al.

[11] Patent Number: 5,922,989
[45] Date of Patent: *Jul. 13, 1999

[54] ELECTRONIC PART AND METHOD FOR INHIBITING INTRUSION OF SOLDERING FLUX

[75] Inventors: Akimasa Tsunoda; Yuichi Nagase, both of Ohta; Seiichi Katagiri, Kiryu; Shigeo Suzuki, Kasakakemachi; Kiyohumi Nakayama, Azumamura; Kenji Hirota, Ouramachi; Noboru Sato, Kasakakemachi; Tatsuya Tsukagoshi, Ashikaga, all of Japan

[73] Assignee: Mitsuba Electric Manufacturing Co., Ltd., Gunma, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/711,963
[22] Filed: Sep. 6, 1996
[51] Int. Cl.⁶ .................................................. H01L 23/02
[52] U.S. Cl. ........................................ 174/52.5; 257/693
[58] Field of Search .................................... 257/690, 692, 257/693, 672, 678; 174/52.1, 52.4, 52.5; 361/715, 714, 717, 718, 719, 720, 723, 752

[56] References Cited

U.S. PATENT DOCUMENTS

| | | | |
|---|---|---|---|
| 4,642,419 | 2/1987 | Meddles | 174/52 |
| 5,446,623 | 8/1995 | Kanetake | 361/760 |
| 5,619,068 | 4/1997 | Benzoni | 257/690 |

FOREIGN PATENT DOCUMENTS

| | | |
|---|---|---|
| 63-82335 | 5/1988 | Japan . |
| 1577035 | 10/1980 | United Kingdom . |
| 2265768 | 10/1993 | United Kingdom . |
| WO 88/10015 | 12/1988 | WIPO . |

*Primary Examiner*—Kristine Kincaid
*Assistant Examiner*—Hung V. Ngo
*Attorney, Agent, or Firm*—McCormick, Paulding & Huber

[57] ABSTRACT

An electronic part capable of preventing a flux from intruding thereinto without using a sealing material can be provided. In the electronic part 1, terminals 3 to be inserted through electrode holes of a circuit board are projected from a casing 1a. In the terminals 3, there are provided cut-in portions 8 extending to a space formed between the casing 1a and the circuit board when the terminals 3 are inserted through the electrode holes.

1 Claim, 6 Drawing Sheets

5,922,989

ELECTRONIC PART AND METHOD FOR INHIBITING INTRUSION OF SOLDERING FLUX

BACKGROUND OF THE INVENTION

1. Field of the Invention

This invention relates to an electronic part mounted on a circuit board, and more particularly to a technique effective for preventing a flux with which terminals of an electronic part are coated from intruding into the electronic part.

2. Statement of the Related Art

When an electronic part such as a relay, for example, is soldered and mounted onto a circuit board, in order to improve the wetness of a solder, such a flux treatment is adopted that terminals are coated with a flux in a state where the electronic part is temporarily jointed to the circuit board as a prerequisite step of the solder treatment. In short, the flux treatment is adopted to remove oxide layers from the terminals by the flux, to preserve the cleanness of the surface by preventing their repeated oxidation and to lower the surface tension of an interface at the time of the solder treatment, to thereby improve the wetness.

However, since the flux is corrosive, when the flux with which the terminals are coated intrudes into the electronic part due to the capillarity by the surface tension, in a case of a relay, for example, on-off failure of a contact point and the like takes place as described in Japanese Utility Model Laid-Open No. 63-82335.

In order to prevent the above-described problem, the flux has heretofore been prevented from intruding by sealing portions of the terminals which are close to a casing by use of a sealing material.

However, with the above-described technique, an additional step for sealing the terminals is required, and thus causes the production inefficiency. Furthermore, the sealing material is needed, whereby the costs are increased accordingly.

SUMMARY OF THE INVENTION

Then, it is an object of the present invention to provide a technique capable of preventing a flux from intruding into an electronic part without using a sealing material.

The above-described and other objects, and the novel features of the present invention will become apparent in conjunction with the description of the present specification and the accompanying drawings.

The following is the description of the outline of the typical ones out of the inventions disclosed in the present application.

That is, according to the present invention, an electronic part is constructed such that a terminal to be inserted through an electrode hole of a circuit board is projected from a casing and this terminal is formed with a cut-in portion extending to a space formed between the casing and the circuit board when the terminal is inserted through the electrode hole.

Furthermore, another electronic part according to the present invention is constructed such that a terminal to be inserted through an electrode hole of a circuit board is projected from a casing and this terminal is formed with a through-hole positioned between the casing and the circuit board when the terminal is inserted through the electrode hole.

The casings of these electronic parts may be formed with cut-away portions to be retracted at the positions of the terminals.

By the above-described means, the flux can be prevented from intruding into the electronic part due to the surface tension of the flux in the cut-in portion or the through-hole during the flux treatment.

DESCRIPTION OF THE PREFERRED EMBODIMENT

Figure 1:
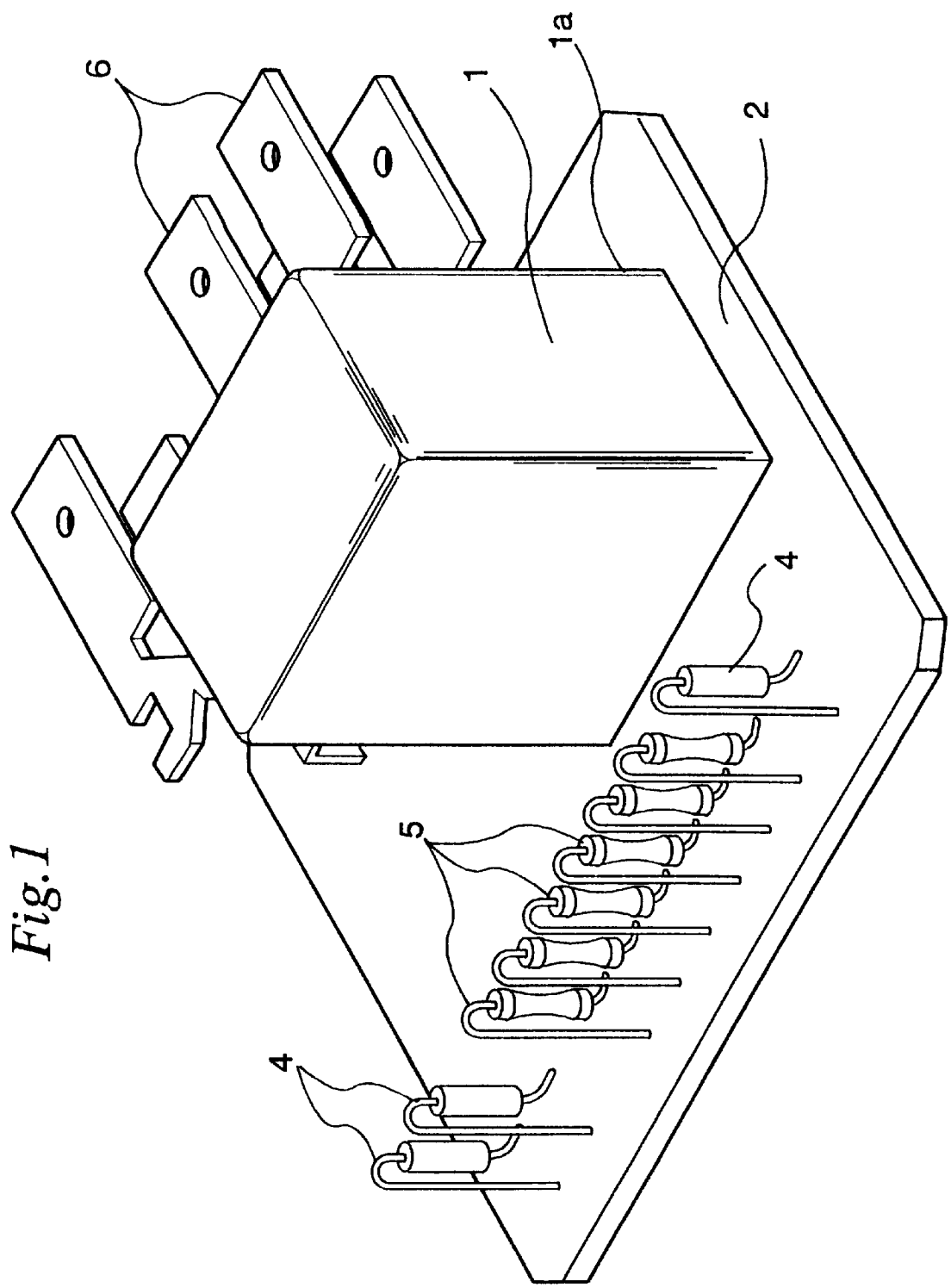
FIG. 1 is an oblique view showing a state where an electronic part and peripheral parts thereof in an embodiment of the present invention are secured to a circuit board.
Figure 2:
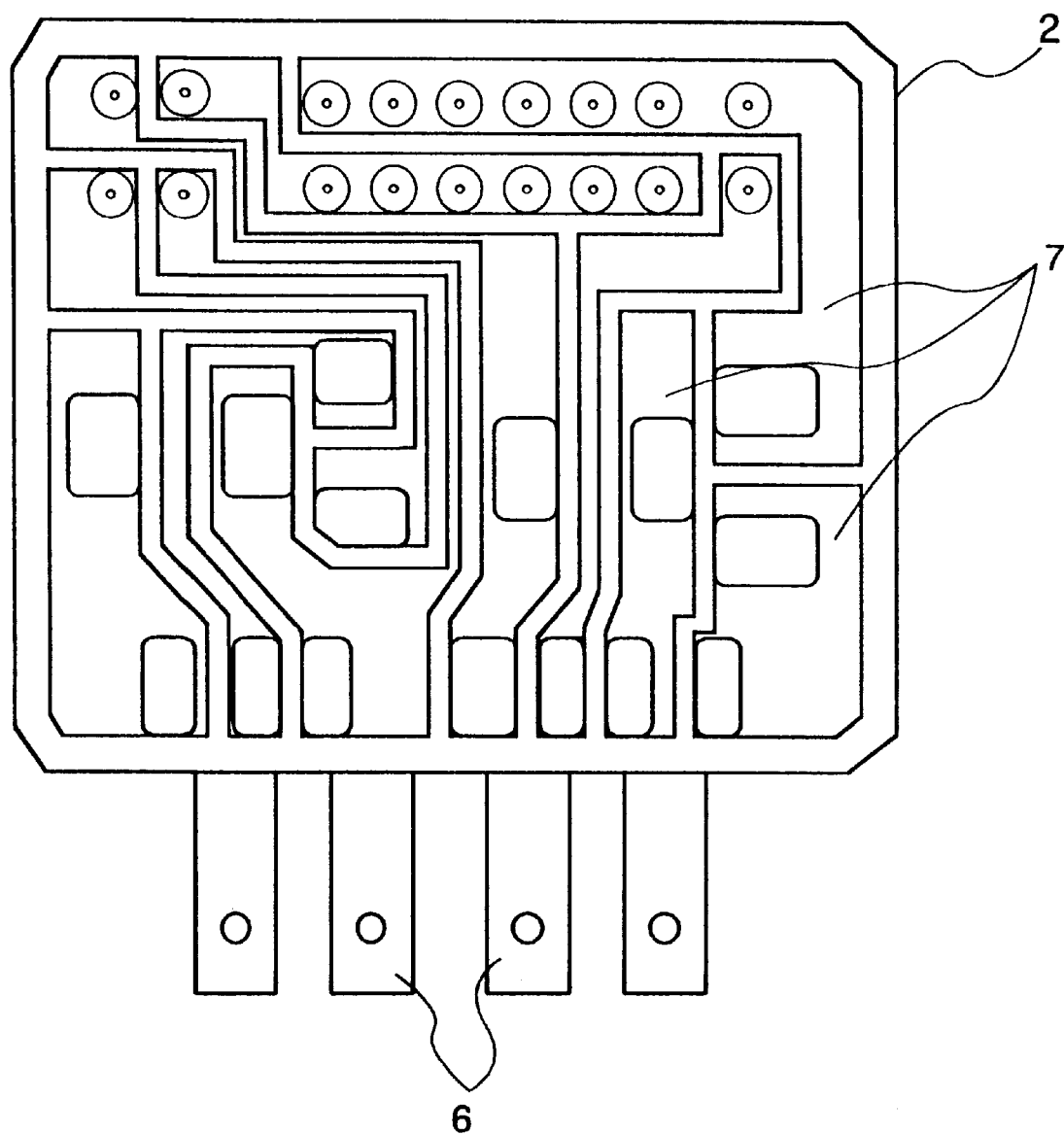
FIG. 2 is a bottom view showing the circuit board of the electronic part illustrated in FIG. 1.

Embodiments of the present invention will hereunder be described with reference to the accompanying drawings. Incidentally, in the all of the drawings explaining the embodiments, same reference numerals are used to designate same or similar parts having the same functions, so that the doubled descriptions need not be repeated.

An electronic part 1 in this embodiment is an electromagnetic relay used for switching of an electric equipment for a motor vehicle, for example. In a casing 1a thereof, there are provided an electromagnet, and fixed contact terminals and movable contact terminals, both of which are contacted with or separated from the electromagnet. Incidentally, the electronic part 1 according to the present invention can be made to be any other various electronic parts having terminals 3 fixed to a circuit board 2 (Refer to FIGS. 3 to 6).

As shown in FIG. 1, the circuit board 2 is mounted thereto with peripheral parts such as a diode 4, a resistance 5 and a connecting terminal 6 in addition to the electronic part 1, and these members are integrated to construct an electronic part unit. The circuit board 2 has a front surface 16 and a rear surface 17.

Figure 3:
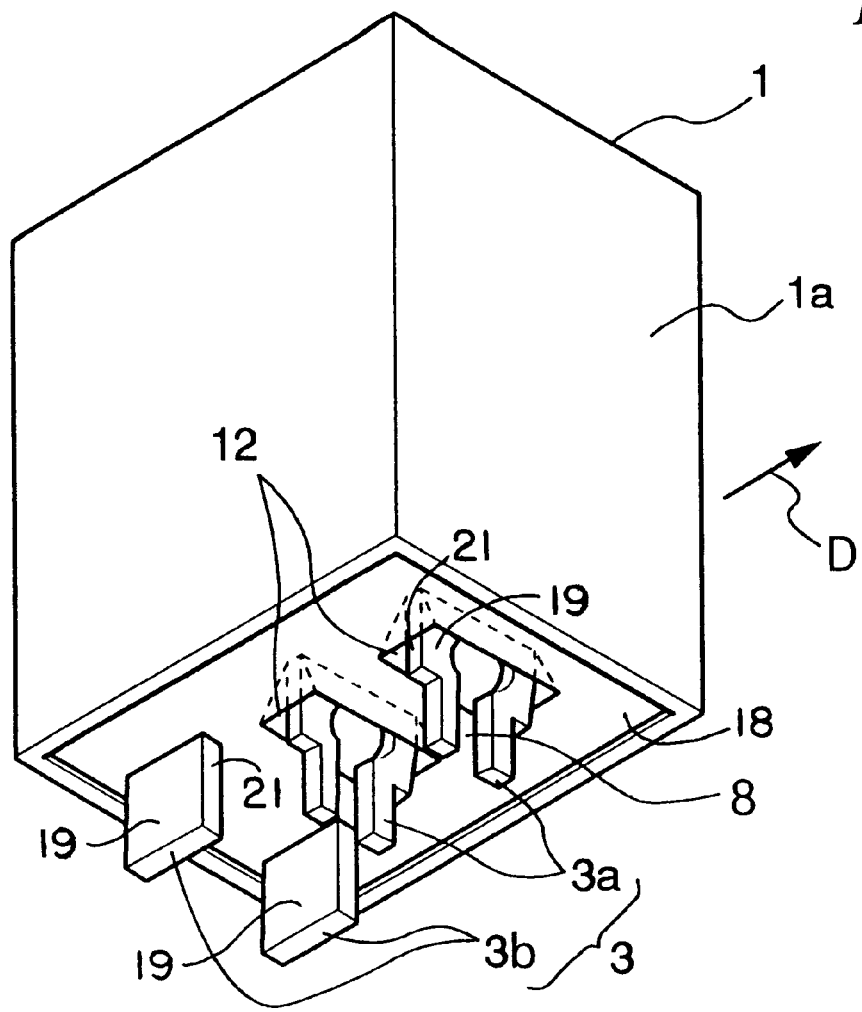
FIG. 3 is an oblique view showing the electronic part illustrated in FIG. 1.

As shown in FIG. 3, at a bottom surface 18 of the casing 1a of the electronic part 1, there are provided four terminals 3 projecting therefrom, for example. These terminals 3 are directed in two directions perpendicular to each other. Each terminal has two parallel major surfaces 19 and two parallel minor surfaces 21.

Figure 4:
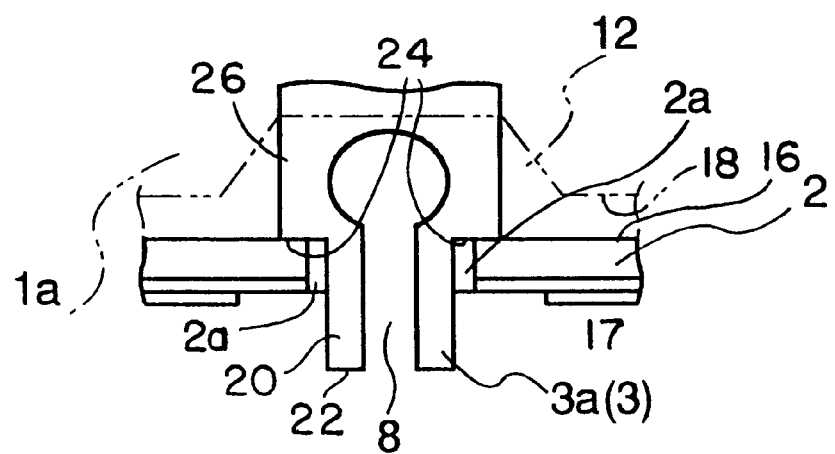
FIG. 4 is a front view showing the essential portions of the electronic part illustrated in FIG. 3.

The two terminals 3a having surfaces opposite to a moving direction D of the electronic part 1 in the flux treatment to be described hereunder are formed with cut-in portions 8 as differed from the other two terminals 3b. As shown in FIG. 4, each terminal 3a has a forward portion 20 sized to fit through its associated hole 2a in the circuit board 2 and to extend beyond the rear surface 17 of the board 2 when the terminals are inserted into the holes of the circuit board so as to enter those holes from the circuit board front surface 16. The forward portion of each terminal 3a has a free end 22 and a rear end defined by a pair of forwardly facing shoulders 24 which engage the front surface 16 of the board to limit the insertion of the terminal. Each terminal 3a further has a rear portion 26 extending from the shoulders 24 to the bottom surface 18 of the casing 1a so that the bottom surface 18 of the casing is spaced from the front surface 16 of the board 2. Each of the cut-in portions 8 each of these cut-in portions 8 extends from the forward end 22 of the terminal 3a to the rear portion 26 of the terminal 3a, but does not extend to the bottom surface 18 of the casing 1a. Each cut-in portion 8 has a rounded rear end located between the casing 1a and the circuit board 2. Accordingly, a forward portion 20 of each of the terminals 3a which is divided into two parts by the cut-in portion 8 is inserted into an electrode hole 2a of the circuit board 2. Incidentally, each of the cut-in portions 8 may have a length reaching the casing 1a. Furthermore, the other terminals 3b may be formed with the above-described cut-in portions 8 including other embodiments to be described hereunder.

As shown, the casing 1a is formed with a cut-away portion 12 which is retracted at the positions of the terminals 3a, whereby a large clearance is formed between the electrode hole 2a and the casing 1a. Incidentally, this cut-away portion 12 may not be provided.

Figure 5:
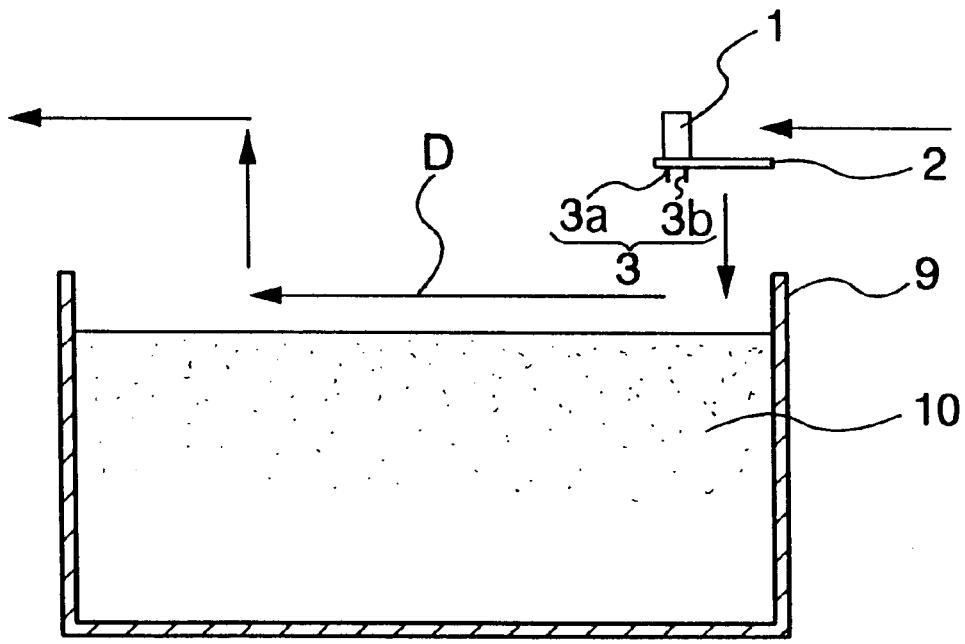
FIG. 5 is an explanatory view showing the flux treatment of the electronic part illustrated in FIG. 3.

Here, in the electronic part 1 inserted into the electrode holes 2a of the circuit board 2 and temporarily jointed thereto, in order to remove oxide layers of the terminals 3 and improve the wetness at the time of the solder treatment which is performed thereafter, the flux treatment, in which the terminals 3 are immersed in a flux tank 9, is performed. Such a method is performed that, as shown in FIG. 5, the rear surface of the circuit board 2, i.e., the side where the electronic part 1 and the like are not mounted are immersed in a flux 10 and moved, whereby the flux 10 is coated. Then, in this embodiment, the major surfaces 19 of the two terminals 3a which are formed with the cut-in portions 8 (Refer to FIGS. 3, 4 and 6) out of the four terminals provided on the electronic part 1, are opposed to the moving direction D of the electronic part 1, while the electronic part 1 is moved.

By coating the flux 10 while the electronic part 1 is moved as described above, in the terminal 3a having the surface opposed to the moving direction D, since the sectional area in the widthwise direction of the terminal 3a is decreased at the cut-in portion 8 when the flux 10 reaches the space formed between the casing 1a and the circuit board 2, the rise of the flux 10 due to the surface tension can be avoided.

Figure 6:
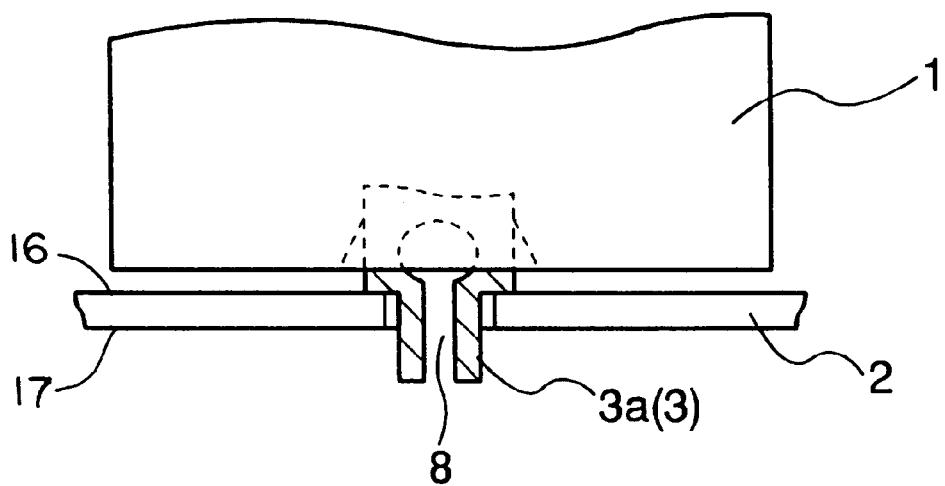
FIG. 6 is a front view showing the essential portions of the electronic part illustrated in FIG. 3 after the flux treatment.

Accordingly, in the terminal 3a, the flux 10 is coated only to hatched portions shown in FIG. 6, so that the flux 10 does not intrude into the electronic part 1 by the capillarity. With this arrangement, such a matter that the interior of the electronic part 1 is corroded by the flux 10 and on-off failure at a contact point in the electromagnetic relay takes place can be previously avoided.

Figure 7:
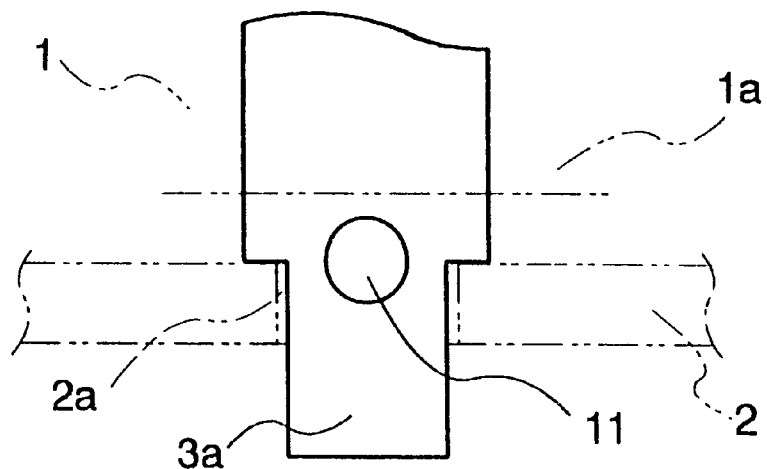
FIG. 7 is a front view showing a terminal of an electronic part in another embodiment of the present invention.

FIG. 7 is the front view showing the terminal of the electronic part in another embodiment of the present invention.

In the electronic part 1 of this embodiment, there is formed a circular through hole 11 in each of the terminals 3a having the surfaces opposite to the moving direction of the electronic part 1 during the flux treatment.

This through-hole 11 is formed to be positioned between the casing 1a and the circuit board 2 in the state where the terminal 3a is inserted through the electrode hole 2a.

When the above-described through-hole 11 is formed in each of the terminals 2a, by the decreased sectional area in the widthwise direction due to this through-hole 11, the flux can be prevented from intruding into the electronic part 1 due to the action of surface tension similarly to the case of the embodiment 1.

Figure 8:
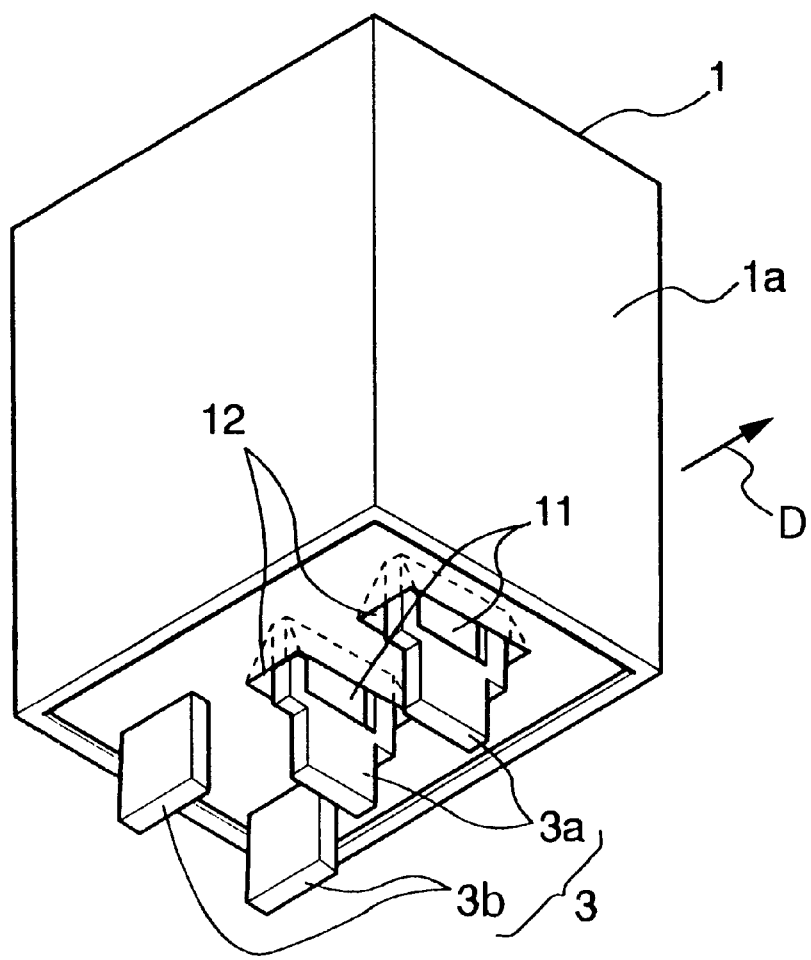
FIG. 8 is an oblique view showing an electronic part in a further embodiment of the present invention.
Figure 9:
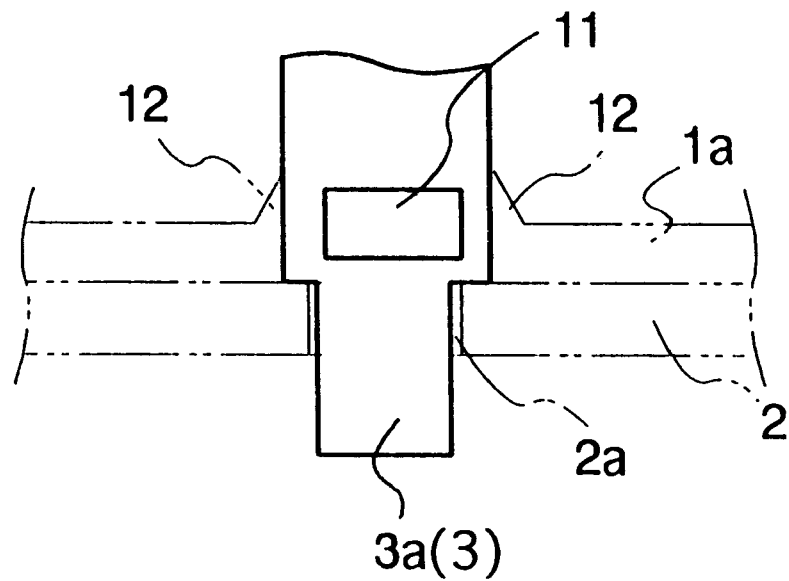
FIG. 9 is a front view showing the terminal of the electronic part illustrated in FIG. 8.

FIG. 8 is the oblique view showing the electronic part in the further embodiment of the present invention, and FIG. 9 is the front view showing the terminal of the electronic part in the still further embodiment of the present invention.

In the electronic part 1 of this embodiment, a square through-hole 11 is formed in each of the terminals 3a having the surfaces opposite to the moving direction D of the electronic part during the flux treatment, and a cut-away portion 12, within which the casing 1a is retracted, is formed at the positions of the terminals 3a. As described above, the through-hole may be formed to provide shapes other than a circle such as a square.

As has been described hereinabove, the invention invented by the present invention has been described in detail, however, the present invention should not necessarily be limited to the above-described embodiments, and it is needless to say that the invention may be variously modified within a scope not departing from the gist.

Figure 10:
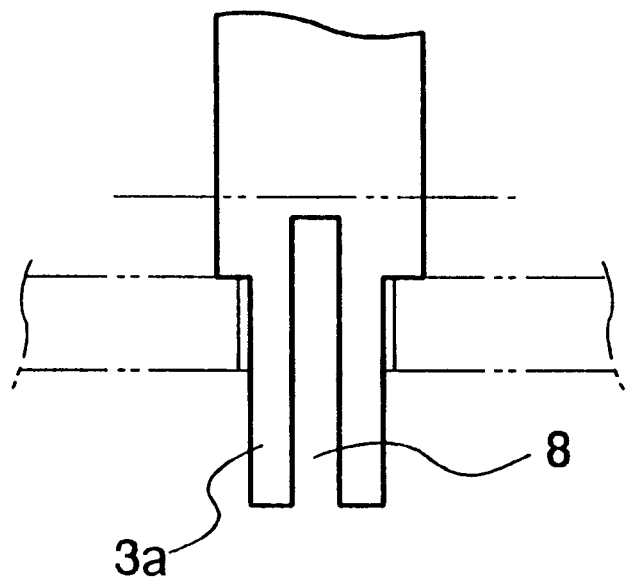
FIG. 10 is a front view showing a terminal of an electronic part in a still further embodiment of the present invention.

For example, the shape of the cut-in portion 8 should not necessarily be limited to the one shown in the embodiment 1, and it is possible to adopt various shapes such as rectilinear cut-in portions 8 as shown in FIG. 10.

The following is the brief description of the effects obtained by the typical ones out of the inventions disclosed in the present application.

(1) That is, according to the electronic part in the present invention, since the sectional area in the widthwise direction of each of the terminals due to the cut-in portions and the through-holes, which are formed in the terminals, the rising route of the flux, which has risen during the flux treatment, is narrowed, and the flux does not rise further due to the surface tension acting at this position, so that the flux can be prevented from intruding into the electronic part. Accordingly, the flux is prevented from intruding into the electronic part due to the capillarity without using the sealing material, so that the troubles within the electronic part due to the corrosion of the flux do not take place.

(2) Then, the intrusion of the flux can be prevented without using the sealing material, so that the number of man-hour for sealing the terminals can be dispensed with, to thereby improve the production efficiency.

(3) Costs can be decreased as much as the sealing material is dispensed with.

What is claimed is:

1. An electromagnetic relay for attachment to a circuit board having front and rear surfaces and electrode holes extending through said board from said front surface to said rear surface for receiving electrical terminals of said relay intended to be fixed and electrically connected to said board by a soldering process including the insertion of said terminals through said circuit board so that forward portions thereof protrude beyond said rear surface of said circuit board followed by the immersion of said forward portions of said terminals in a tank of soldering flux, said relay comprising:

a casing having a bottom surface;

said terminals projecting outwardly from said bottom surface of said casing;

each of said terminals having one of said forward portions sized to fit into and through a respective one of said electrode holes of said it board and to protrude beyond said rear surface of said circuit board when said terminals are inserted into said holes so as to enter said holes from said front surface of said circuit board, said forward portions each having a forward free end and a rear end located rearwardly of said forward free end, and at least one forwardly facing shoulder located at said rear end of each of said forward portions, which said forwardly facing shoulder is engagable with said front surface of said circuit board to limit insertion of each of said terminals into said circuit board to a point at which said bottom surface of said casing is spaced from said front surface of said circuit board, each of said terminals also having a rearward portion extending from said rear end of said forward portion thereof to said bottom surface of said casing, each of said forward and rearward portions of said terminals being of generally rectangular cross-sections so as to have two parallel major surfaces and two parallel minor surfaces, and each of said terminals having a cutaway portion located at least in part in said rearward portion thereof but not extending to said bottom surface of said casing, so that when said shoulders engage said front surface of said circuit board at least a part of said cutaway portions is located between said front surface of said circuit board and said bottom surface of said casing which said cutaway portions provide said terminals with reduced areas as seen looking in a direction perpendicular to said major surfaces so that when said terminals are inserted into said circuit board to the point at which said shoulders engage said front surface of said circuit board and the portions of said terminals which protrude beyond the rear surface of said circuit board are immersed into said tank of soldering flux, to the point at which said soldering flux engages said bottom surface of said circuit board, and then moved in a direction perpendicular to said major surfaces said cutaway portions of said terminals inhibit said flux from rising to the point of reaching said bottom surface of said casing and possibly intruding into said casing.

\* \* \* \* \*